US012757332B2

(12) United States Patent
Nakamiya et al.

(10) Patent No.: US 12,757,332 B2
(45) Date of Patent: Oct. 6, 2026

(54) FLEXIBLE PRINTED CIRCUIT TO SUSPENSION SOLDERING IMPROVEMENT

(71) Applicant: Western Digital Technologies, Inc., San Jose, CA (US)

(72) Inventors: Teruhiro Nakamiya, Setagaya (JP); Nobuyuki Okunaga, Odawara (JP); Haruki Nitta, Fujisawa (JP); Junichiroh Hatazawa, Atsuga (JP); Tatsuo Hayakawa, Yokohama (JP)

(73) Assignee: Western Digital Technologies, Inc., San Jose, CA (US)

(*) Notice: Subject to any disclaimer, the term of this patent is extended or adjusted under 35 U.S.C. 154(b) by 224 days.

(21) Appl. No.: 18/636,768

(22) Filed: Apr. 16, 2024

(65) Prior Publication Data

US 2025/0324515 A1 Oct. 16, 2025

(51) Int. Cl.
*H05K 1/11* (2006.01)
*H05K 1/189* (2026.01)

(52) U.S. Cl.
CPC ............. *H05K 1/189* (2013.01); *H05K 1/111* (2013.01); *H05K 2201/09227* (2013.01); *H05K 2201/09254* (2013.01); *H05K 2201/10159* (2013.01)

(58) Field of Classification Search
CPC ................... H01K 1/189; H05K 1/111; H05K 2201/09227; H05K 2201/09254; H05K 2201/10159
USPC .......................................................... 361/749
See application file for complete search history.

(56) References Cited

U.S. PATENT DOCUMENTS

| | | | | |
|---|---|---|---|---|
| 6,408,508 | B1 | 6/2002 | Farnworth et al. | |
| 6,703,566 | B1 | 3/2004 | Shiraishi et al. | |
| 8,295,013 | B1 | 10/2012 | Pan et al. | |
| 8,325,446 | B1 * | 12/2012 | Liu ...................... | G11B 5/4833 360/245.9 |
| 11,074,931 | B1 * | 7/2021 | Aoki .................... | G11B 25/043 |
| 11,818,834 | B2 | 11/2023 | Kishimoto et al. | |
| 2006/0157853 | A1 | 7/2006 | Ho et al. | |

(Continued)

FOREIGN PATENT DOCUMENTS

CN 112530464 A 3/2021

OTHER PUBLICATIONS

Phongphanphahnee, Anan et al., Flexible Printed Circuit on Suspension of Hard Disk Drive, Fujikura Technical Review, 2004, pp. 40-43.

*Primary Examiner* — Binh B Tran
(74) *Attorney, Agent, or Firm* — John D. Henkhaus

(57) ABSTRACT

A hard disk drive flexible printed circuit (FPC) includes fingers extending from a main portion from a root to a tip, with each finger including a first conductive trace layer positioned on a first side of a base layer and including a particular plurality of electrical pads extending to an edge, and a second conductive trace layer positioned on an opposing second side of the base layer. Particular traces of the second conductive trace layer electrically connected to the pads are configured to inhibit bubbling of an adhesive layer in response to heating of the pads. This may involve routing so as not to overlap with the pads to inhibit heat transfer from the pads to the second conductive trace layer during soldering, and/or configuring such that the adhesive layer between the particular traces is wider than each particular trace to maximize exposure of evaporative surface area of adhesive layer.

20 Claims, 12 Drawing Sheets

(56) References Cited

U.S. PATENT DOCUMENTS

2022/0415346 A1 12/2022 Nakamiya et al.
2022/0418078 A1* 12/2022 Nakamiya ............ H05K 3/4644
2023/0276566 A1 8/2023 Nakamiya et al.

* cited by examiner

FLEXIBLE PRINTED CIRCUIT TO SUSPENSION SOLDERING IMPROVEMENT

FIELD OF EMBODIMENTS

Embodiments of the invention may relate generally to hard disk drives, and particularly to approaches to stable soldering of flexible printed circuit to suspension.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

To write data to the medium, or to read data from the medium, the head has to receive instructions from a controller. Hence, the head is connected to the controller in some electrical manner so that not only does the head receive instructions to read/write data, but the head can also send information back to the controller regarding the data read and/or written. Typically, a flexible printed circuit (FPC) is used to electrically transmit signals from the read-write head via a suspension tail to other electronics within an HDD. The FPC and the suspension tail are typically soldered together at a comb or "E-block" portion (see, e.g., carriage 134 of FIG. 1) of a head-stack assembly (HSA). To connect them with solder, the suspension electrical pads and the FPC electrical pads are heated. If the soldering temperature is low the solder may not melt, whereas if the soldering temperature is high these components may be damaged by the heat. Thus, it is desirable to avoid damage from the soldering process. Otherwise, the corresponding electrical interconnections may be compromised, which can lead to compromised flow of data to/from the head.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to a stable soldering of a flexible printed circuit to a suspension, such as for a hard disk drive (HDD), are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

Introduction

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment or to every embodiment.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the structure is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

At a distal end of an HDD suspension, there is a read-write transducer (or "head") to read and write data. At the other proximal end of the suspension, there are electrically conductive pads (or "electrical pads" or simply "pads") to electrically connect to corresponding electrically conductive pads on a flexible printed circuit (FPC). The suspension pads and the FPC pads are electrically interconnected (orthogonally in this instance), typically with solder.

Figure 1:
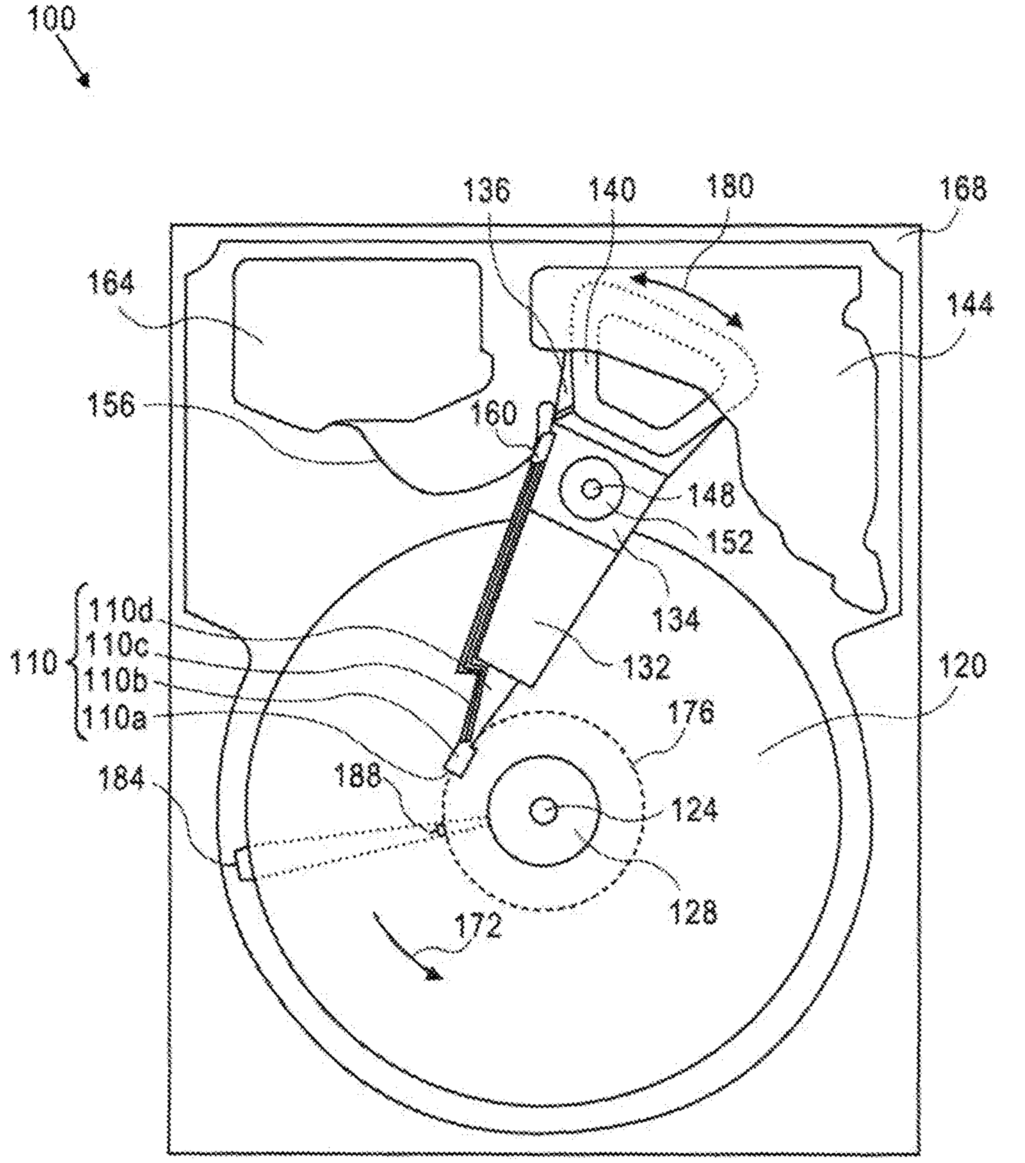
FIG. 1 is a plan view illustrating a hard disk drive, according to an embodiment.
Figure 2A:
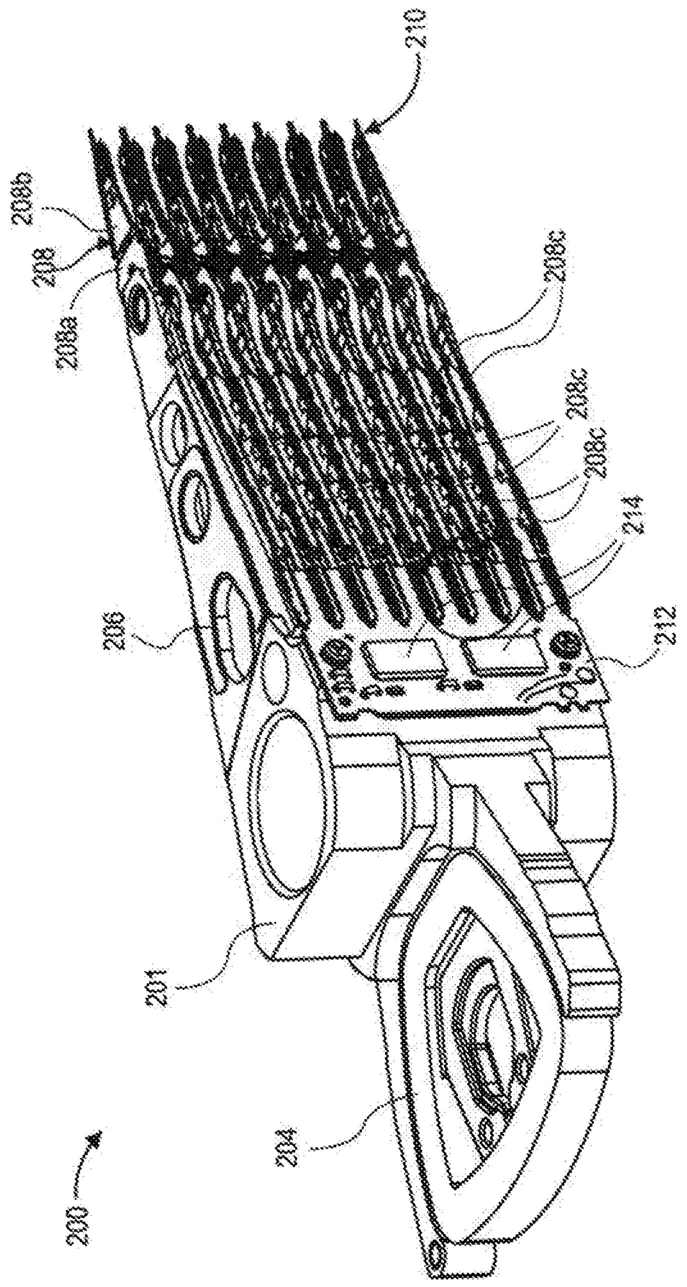
FIG. 2A is a perspective view illustrating an actuator assembly, according to an embodiment.

FIG. 2A is a perspective view illustrating an actuator assembly, according to an embodiment. Actuator assembly 200 comprises a carriage 201 (see, e.g., carriage 134 of FIG. 1) rotatably coupled with a central pivot shaft (not shown here; see, e.g., pivot shaft 148 of FIG. 1) by way of a pivot bearing assembly (not shown here; see, e.g., pivot bearing assembly 152 of FIG. 1), and rotationally driven by a voice coil motor (VCM), of which a voice coil 204 is illustrated here. Actuator assembly 200 further comprises one or more actuator arm 206 (see, e.g., arm 132 of FIG. 1), to each of which is coupled a suspension assembly 208 (see, e.g., lead suspension 110*c* of FIG. 1) housing a read-write head 210 (see, e.g., read-write head 110*a* of FIG. 1), and typically comprising a swaged baseplate 208*a*, a load beam 208*b* (see, e.g., load beam 110*d* of FIG. 1), and a suspension tail 208*c* (only some of which are labeled here). Each suspension assembly 208 is electrically connected with a flexible printed circuit (FPC) 212 coupled with the carriage 201, by way of suspension tail 208*c*. As such, the electrical conductors, leads, wires, traces on each suspension assembly 208 lead to the FPC 212 which comprises one or more FPC finger(s) 212*a* (FIGS. 2B-2C) with which each suspension tail 208*c* is electrically and mechanically coupled, e.g., via solder pads.

Figure 2B:
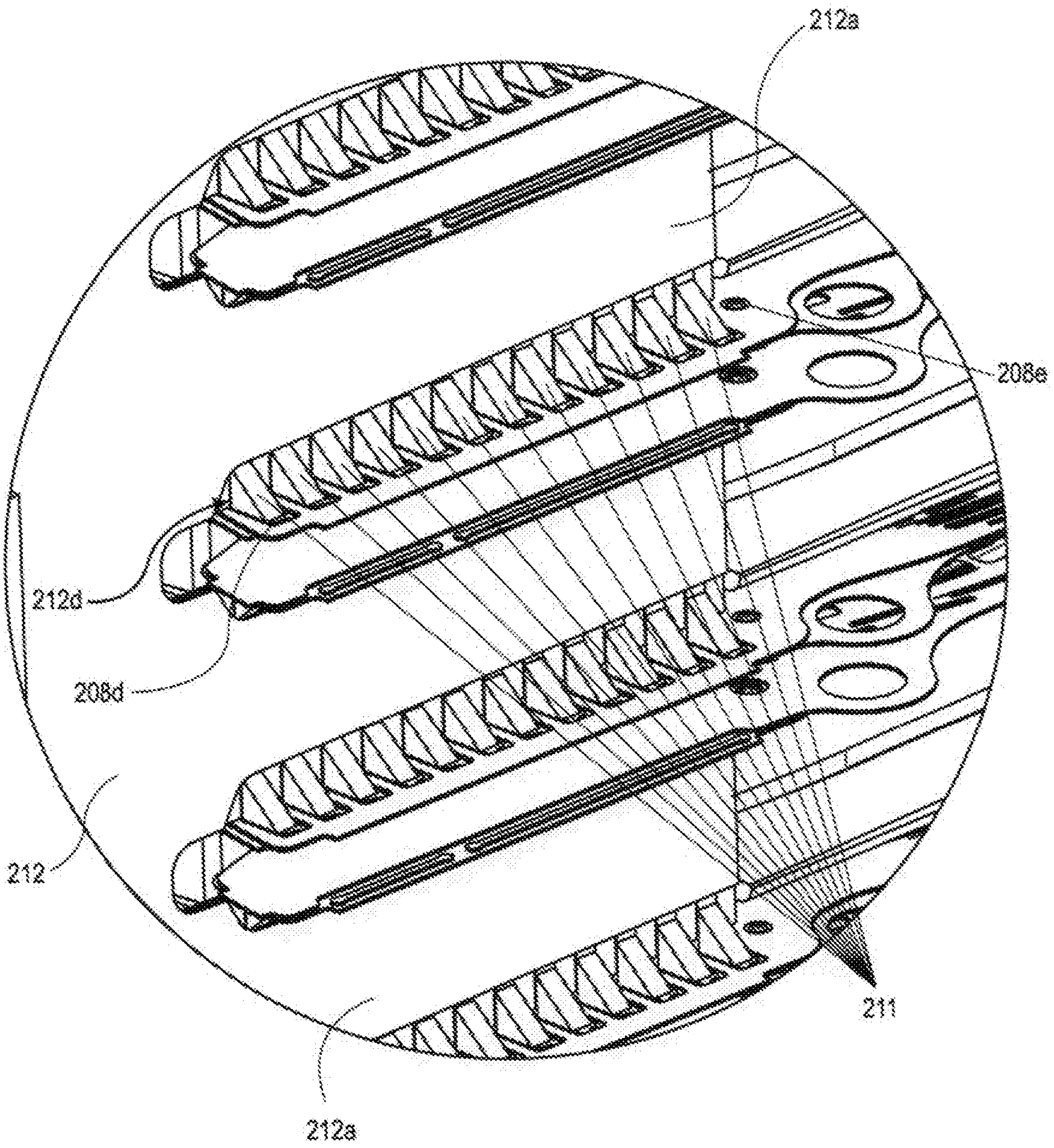
FIG. 2B is a perspective view illustrating an electrical interconnection between a suspension tail and a flexible printed circuit (FPC), according to an embodiment.

FIG. 2B is a perspective view illustrating an electrical interconnection between a suspension tail and a flexible printed circuit (FPC), according to an embodiment. FIG. 2B depicts a suspension tail tip 208*e* of the suspension tail 208*c* (FIG. 2A) mechanically and electrically coupled to a corresponding FPC finger 212*a* of the FPC 212, by way of solder 211 (or some other electrical connection means). Particularly, electrical pads 208*d* on the suspension tail tip 208*e* are electrically connected to electrical pads 212*d* of the FPC 212. Oftentimes the electrical pads 212*d* of each FPC finger 212*a* of the FPC 212, and/or the electrical pads 208*d* on suspension tail tip 208*e* of suspension assembly 208 (FIG. 2A), are provisioned with pre-solder pads prior to the solder interconnection procedure for the FPC 212 to suspension tail tip 208*e*. "Pre-solder" generally refers to preforming solder bumps onto a pad prior to a reflow-based component bonding procedure. In the context of FIG. 2B that would mean that pre-solder bumps of solder material are formed onto or over each electrical pad 208*d* of suspension 208 and/or each electrical pad 212*d* of FPC 212, so that each pre-solder bump can be heated to reflow to then electrically bond with a corresponding electrical pad. Typically, solder reflow, hot air, or a laser may be used to heat the materials in the soldering procedure.

Figure 2C:
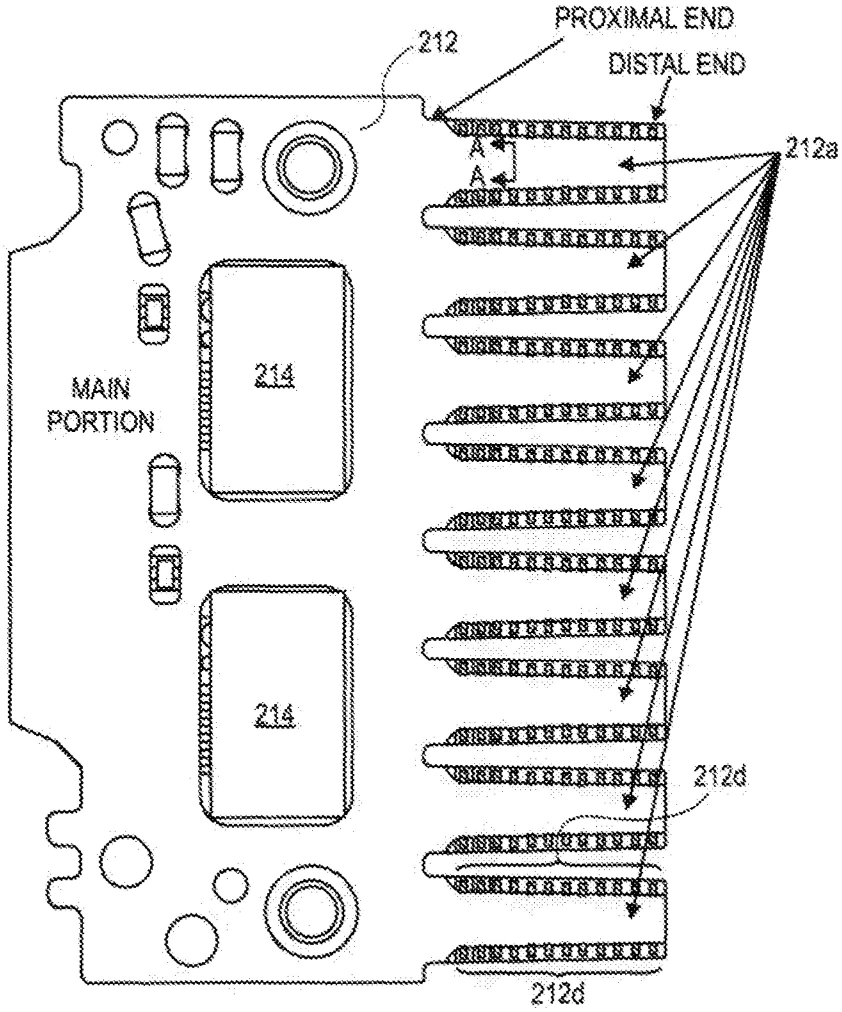
FIG. 2C is a plan view illustrating an FPC, according to an embodiment.

FIG. 2C is a plan view illustrating a flexible printed circuit, according to an embodiment. Here, FPC 212 comprises a plurality of FPC fingers 212*a*, each comprising a plurality of electrical pads 212*d* on each of the upper side/edge and the lower side/edge. Each FPC finger 212*a* typically services both an UP head (a read-write head facing upwards to service a bottom surface of a corresponding disk) and a DN head (a read-write head facing downwards to service a top surface of a corresponding disk), electrically connecting each corresponding UP suspension and DN suspension to a preamp 214 (or beyond) mounted on the FPC 212. A cross-section of a FPC finger 212*a* is labeled A-A.

Figure 2D:
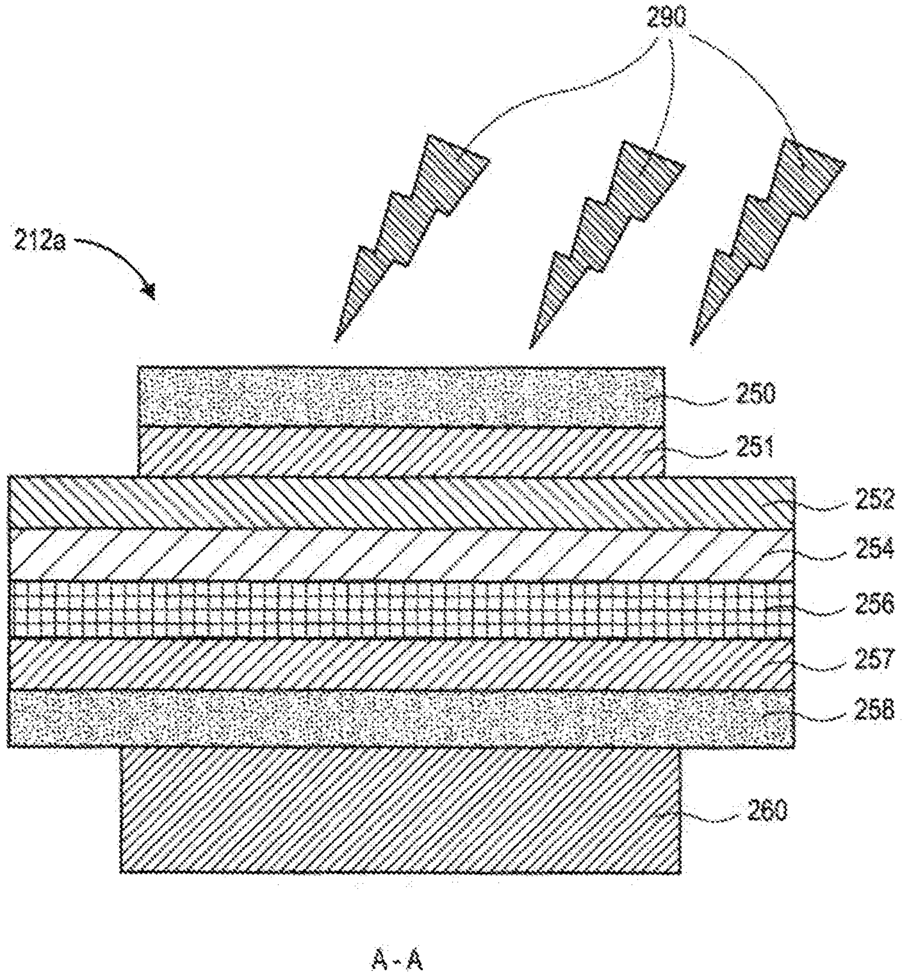
FIG. 2D is a cross-sectional view illustrating the FPC of FIG. 2C, according to an embodiment.

FIG. 2D is a cross-sectional view illustrating the FPC of FIG. 2C, according to an embodiment. Cross-sectional view A-A depicts the layers of an FPC finger such as FPC finger 212*a*, comprising a base film 254 (e.g., a polyimide insulating layer) interposed between a top first conductive layer 252 (e.g., or "trace layer" or "copper layer" comprising copper traces) and a bottom second conductive layer 256 (e.g., or "trace layer" or "copper layer" comprising copper traces). The first conductive layer 252 is covered by a first cover film 250 (e.g., a polyimide insulating layer) with a first adhesive layer 251 therebetween, and the second conductive layer 256 is covered by a second cover film 258 (e.g., a polyimide insulating layer) with a second adhesive 257 layer therebetween. Finally, all of the foregoing layers are coupled with and supported by a bottom stiffener layer 260 (e.g., comprising aluminum, or some other stiff and durable material). The precise layout of FPC finger 212*a* may vary from implementation to implementation, so the layout of FIG. 2D is presented as one example. However, the techniques described herein are widely applicable to alternative FPC layouts having multiple overlaid conductive layers.

Recall that with soldering and other similar electrical interconnection techniques, the suspension electrical pads and the FPC electrical pads are heated, and if the soldering temperature is too low then the solder may not melt and if the soldering temperature is too high then the FPC may be damaged by the heat. For example, while heated from above (as depicted by heat icons/symbols 290 in FIG. 2D), observation indicates that a bubble may occur on the FPC finger 212*a*, such as between the second conductive layer 256 and the adjacent second adhesive 257. This issue may be especially present in view of the trend toward increasing the number of disks assembled into an HDD, whereby the disk pitch becomes narrower. Likewise, the FPC fingers 212*a* also become narrower from edge to edge, which may lead to FPC bubbles becoming even more prevalent due to the heat capacity of each FPC finger 212*a* resultantly decreasing.

Conductive Layer Configurations

Figure 3A:
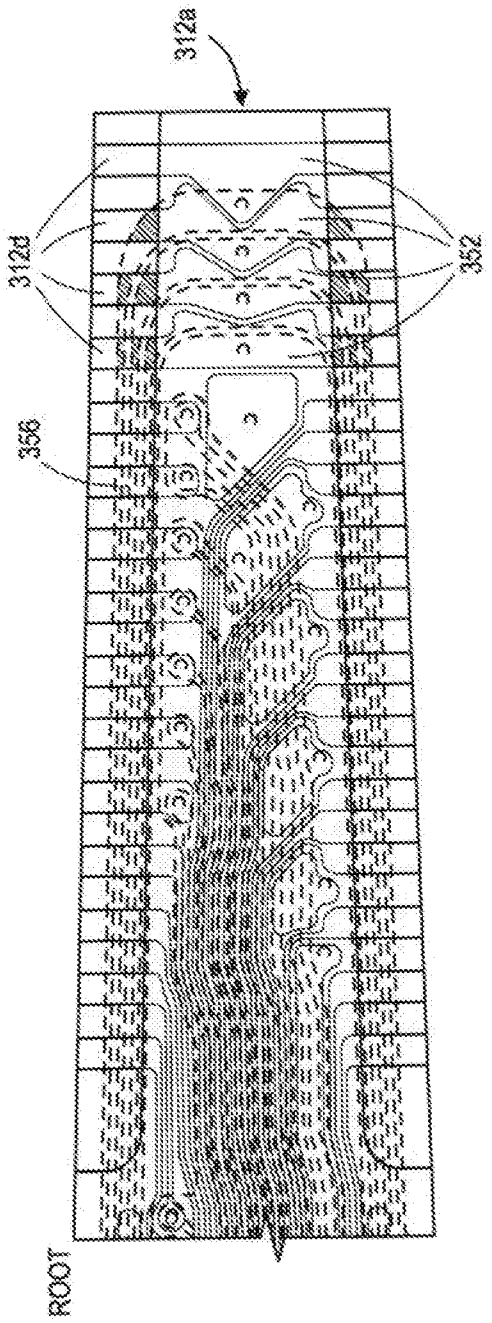
FIG. 3A is a plan view illustrating an FPC finger laminate, according to an embodiment.
Figure 3B:
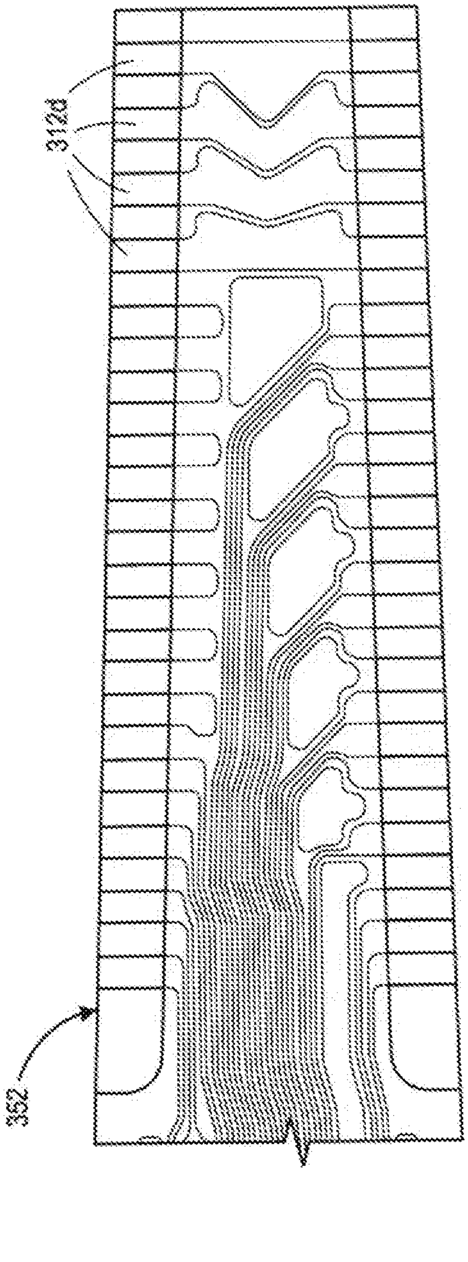
FIG. 3B is a plan view illustrating a first conductive layer of the FPC finger laminate of FIG. 3A, according to an embodiment.
Figure 3C:
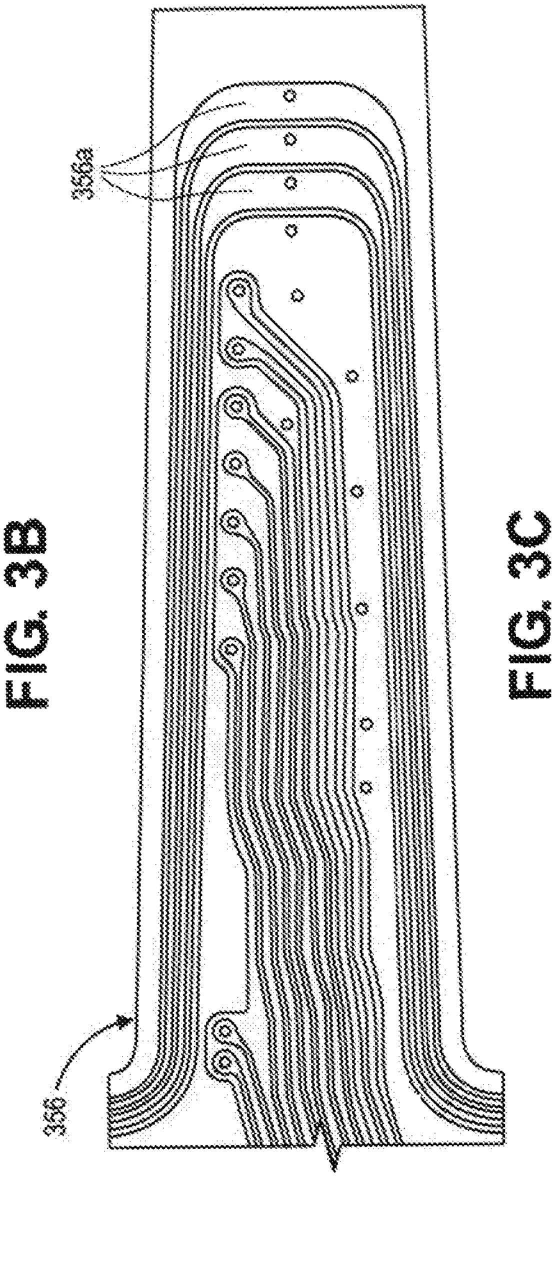
FIG. 3C is a plan view illustrating a second conductive layer of the FPC finger laminate of FIG. 3A, according to an embodiment.

FIG. 3A is a plan view illustrating an FPC finger laminate, FIG. 3B is a plan view illustrating a first conductive layer of the FPC finger laminate of FIG. 3A, and FIG. 3C is a plan view illustrating a second conductive layer of the FPC finger laminate of FIG. 3A, all according to embodiments. FPC finger 312*a* extends from a root portion (or simply "root") extending from a FPC main body (not visible here) to a tip portion (or simply "tip"), and comprises an upper first conductive layer 352 (FIG. 3B; similar in layout to first conductive layer 252 (e.g., copper) of FIG. 2D) and a lower second conductive layer 356 (FIG. 3C; similar in layout to second conductive layer 256 (e.g., copper) of FIG. 2D). When these conductive layers 352, 356 are heated the relatively larger second conductive layer 356 would likely become hotter. Likewise, as discussed elsewhere herein, while electrical pads 312*d* of first conductive layer 352 of FPC finger 312*a* are heated from above and the resultant heat transfers down to the underlying second conductive layer 356 of FPC finger 312*a*, a bubble may occur on the FPC finger 312*a* such as between the second conductive layer 356 and the adjacent second adhesive (see, e.g., second adhesive 257 of FIG. 2D). FPC bubbles are more likely to occur near the pads closest to the tip because heat can be accumulated at the tip which has large copper area. For example, such bubbles are most likely to occur at or near the overlapping conductive area(s) shown here in cross-hatch. However, with the transfer of heat from the relatively large copper area of the first conductive layer 352 closest to the tip end of FPC finger 312*a*, to the relatively large copper area of the second conductive layer 356 closest to the tip end, bubbles may also occur to some extent at areas of the FPC finger 312*a* outside of the overlapping areas.

Figure 4A:
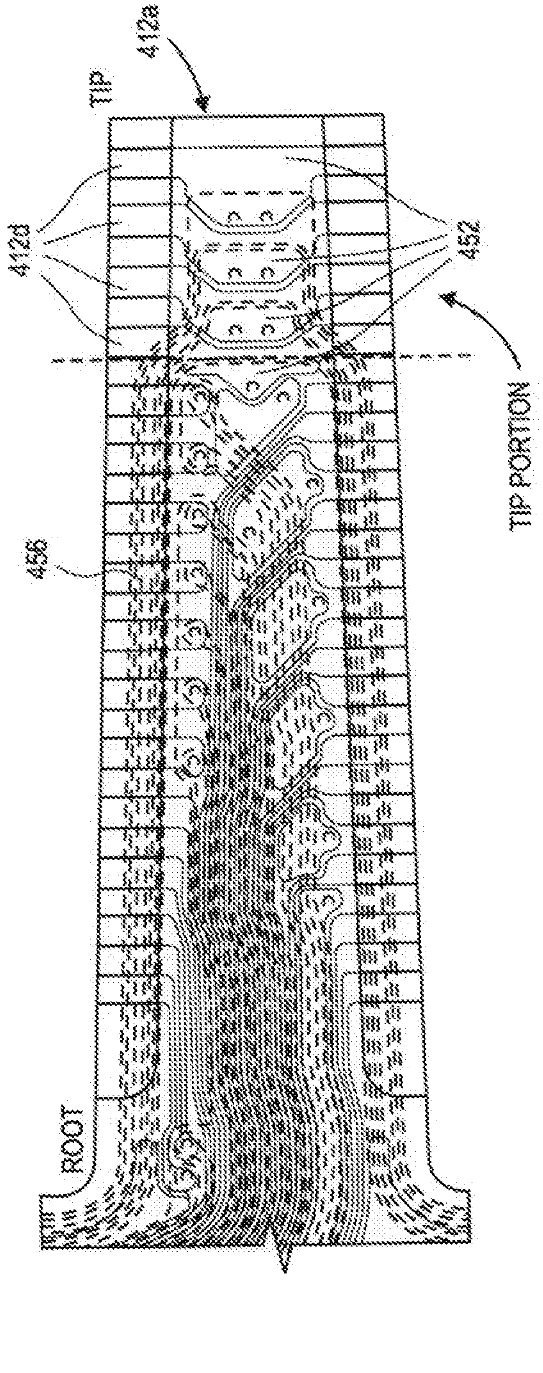
FIG. 4A is a plan view illustrating an "anti-bubbling" FPC finger laminate, according to an embodiment.
Figure 4B:
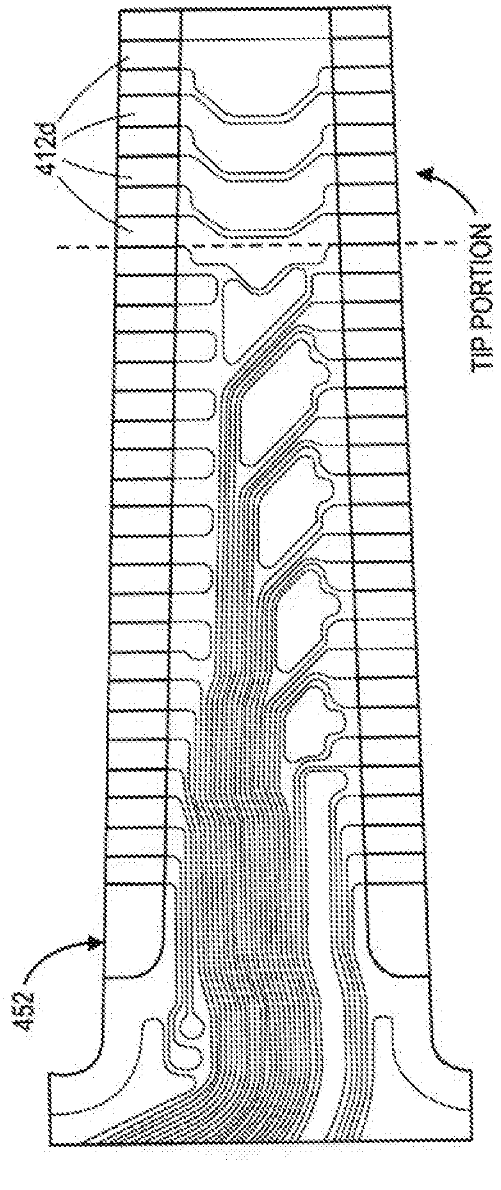
FIG. 4B is a plan view illustrating a first conductive layer of the FPC finger laminate of FIG. 4A, according to an embodiment.
Figure 4C:
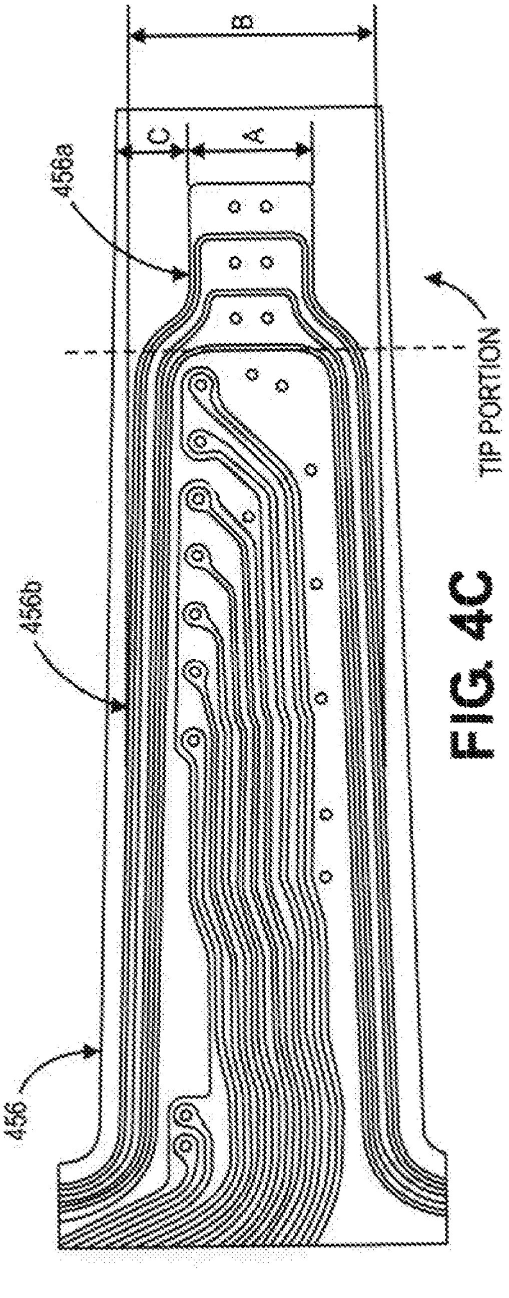
FIG. 4C is a plan view illustrating a second conductive layer of the FPC finger laminate of FIG. 4A, according to an embodiment.

In view of the foregoing likelihood of inadvertently generating bubbles within the FPC finger(s) 312*a*, according to an embodiment the overlapping areas of first and second conductive layers are minimized, by way of judicious routing of traces of the second conductive layer. FIG. 4A is a plan view illustrating an "anti-bubbling" FPC finger laminate, FIG. 4B is a plan view illustrating a first conductive layer of the FPC finger laminate of FIG. 4A, and FIG. 4C is a plan view illustrating a second conductive layer of the FPC finger laminate of FIG. 4A, all according to embodiments. FPC finger 412*a* extends from a root portion (or simply "root") to a tip portion (or simply "tip"), and comprises an upper first conductive layer 452 (FIG. 4B; similar in layout to first conductive layer 252 (e.g., copper) of FIG. 2D) and a lower second conductive layer 456 (FIG. 4C; similar in layout to second conductive layer 256 (e.g., copper) of FIG. 2D). FIG. 4A shows a relatively smaller and narrower (e.g., edge-to-edge direction) second conductive layer 456 trace pattern compared to the second conductive layer 356 of FIGS. 3A, 3C.

More particularly and according to an embodiment, one or more traces of the second conductive layer 456 are routed so as to not be (e.g., substantially not be) underneath a particular plurality of electrical pads 412*d* of the first conductive layer 452, to thereby inhibit heat transfer from the electrical pads 412*d* to the second conductive layer 456. Hence, the risk or likelihood of generating bubbles is less likely to occur in the course of electrically interconnecting (e.g., soldering) the electrical pads 412*d* to corresponding electrical pads of a suspension tail (see, e.g., pads 208*d* (FIG. 2B) of suspension tail tip 208*e* (FIG. 2B) of suspension tail 208*c* (FIG. 2A) of suspension assembly 208 (FIG. 2A)). This is because when the particular electrical pads 412*d* of first conductive layer 452 closest to the tip of FPC finger 412*a* are heated from above, less heat is able to transfer down to the underlying second conductive layer 456, as there is little to no (or negligible) overlapping area(s) of the electrical pads 412*d* toward the tip end of FPC finger 412*a* and the second conductive layer 456. According to an embodiment, electrical pads 412*d* and corresponding traces of second conductive layer 456 are for signals to/from a corresponding secondary or tertiary actuator (e.g., piezo-actuator) coupled with the suspension 208 (FIG. 2A), i.e., generally, a "fine-actuator" for improved head positioning through relatively fine positioning, in addition to and in conjunction with a primary voice coil motor (VCM) actuator which provides relatively coarse positioning. Thus, the positioning and physical dimensions of these fine actuator traces can be changed with little impact on their performance, as there is more design freedom allowed with these particular traces near the tip end (in the "tip portion"). While four electrical pads 412*d* are depicted here as within the "tip portion" of FPC finger 412*a* and corresponding first and second conductive layers 452, 456, the number of electrical pads of the first conductive layer 452 which are avoided by the routing of one or more traces of the second conductive layer 456 may vary from implementation to implementation.

FIG. 4C further illustrates a width dimension "A" to generally represent an average lateral width of a first pattern 456*a* of the traces of the second conductive trace layer 456. Here, the first pattern of traces 456*a* is positioned in an area of the particular plurality of electrical pads 412*d* (FIGS. 4A, 4B) of the first conductive trace layer 452. Further as depicted, to avoid overlapping with the electrical pads 412*d* of the first conductive trace layer 452, the average lateral width of the first pattern 456*a* of traces in the "tip portion" of the second conductive trace layer 456 is narrower than the average lateral width of a second pattern 456*b* of the traces of the second conductive trace layer 456 in a direction beyond the tip portion toward the root. This particular first pattern 456*a* depicted in FIG. 4C utilizes substantially rectangular and/or parallelogrammatic traces of second conductive trace layer 456 at the tip portion. FIG. 4C further illustrates a width dimension "B" to generally represent the average lateral width of the second pattern 456*b* of the traces of the second conductive trace layer 456. The ratio A/B largely depends on a given product configuration and the FPC manufacturing process capability utilized. According to an embodiment, a ratio of A/B falls within a range of 45%-55% that is found suitable for the expressed intended purpose of avoiding FPC bubbling. That is, to avoid overlapping with the electrical pads 412*d*, the average lateral width of the first pattern 456*a* of traces is 45%-55% narrower than the average lateral width of the second pattern 456*b* of the traces.

FIG. 4C further illustrates a distance dimension "C" to generally represent how far away from the edge of FPC finger 412*a* the first pattern 456*a* of the traces are. This is determined by the length of electrical pad 412*d* and any misalignment (e.g., manufacturing tolerance or margin) to be accounted for. The relationships between dimensions A, B, and C may vary from implementation to implementation based, for example, on the foregoing product and manufacturing variabilities. Generally, however, the ratio of A/B is determined by width B and the distance C from the FPC finger 412*a* edge, which is determined by the length of electrical pad 412 and any required margin.

Figure 5A:
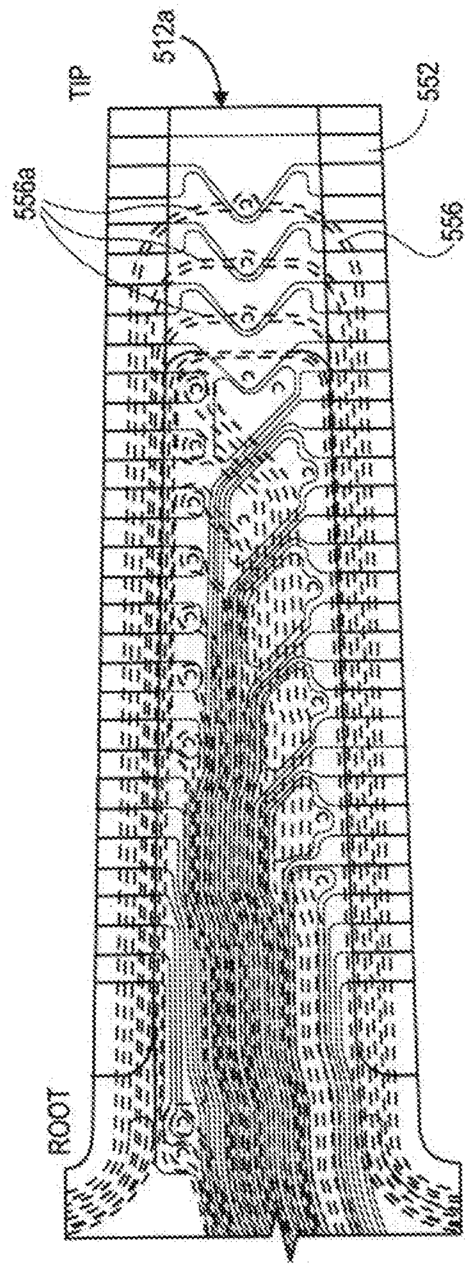
FIG. 5A is a plan view illustrating an "anti-bubbling" FPC finger laminate, according to an embodiment.
Figure 5B:
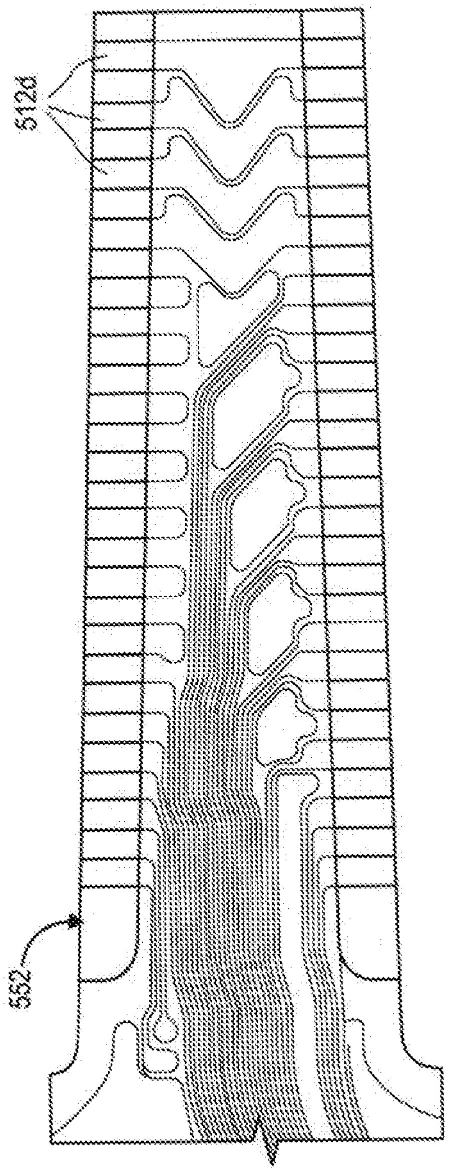
FIG. 5B is a plan view illustrating a first conductive layer of the FPC finger laminate of FIG. 5A, according to an embodiment.
Figure 5C:
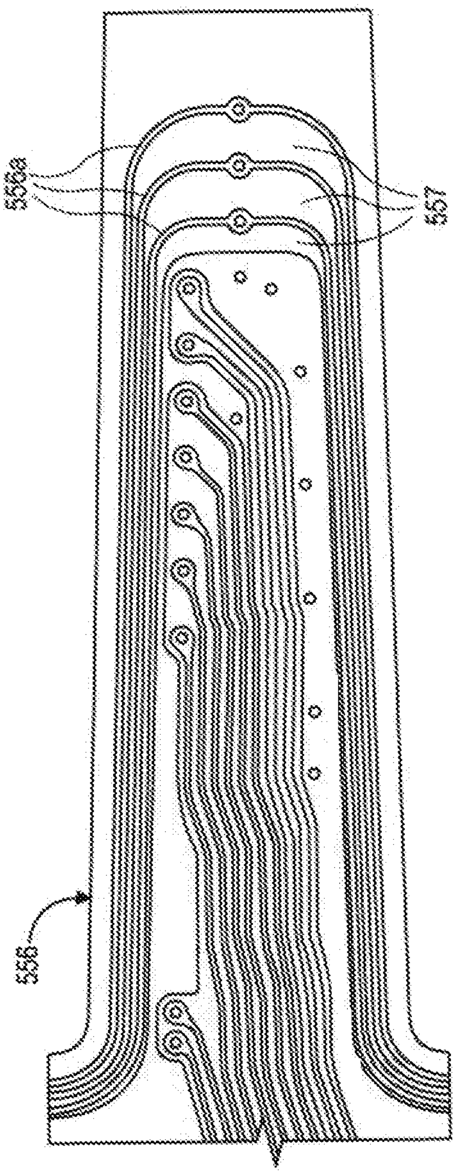
FIG. 5C is a plan view illustrating a second conductive layer of the FPC finger laminate of FIG. 5A, according to an embodiment.

FIG. 5A is a plan view illustrating an "anti-bubbling" FPC finger laminate, FIG. 5B is a plan view illustrating a first conductive layer of the FPC finger laminate of FIG. 5A, and FIG. 5C is a plan view illustrating a second conductive layer of the FPC finger laminate of FIG. 5A, all according to embodiments. FPC finger 512*a* extends from a root to a tip, and comprises an upper first conductive layer 552 (FIG. 5B; similar in layout to first conductive layer 252 (e.g., copper) of FIG. 2D) and a lower second conductive layer 556 (FIG. 5C; similar in layout to second conductive layer 256 (e.g., copper) of FIG. 2D). FIG. 5A shows significantly narrower traces 556*a* of second conductive layer 556 compared to the same area and functionality of traces 356*a* of the second conductive layer 356 of FIG. 3C.

More particularly and according to an embodiment, one or more particular traces 556*a* of the second conductive layer 556, which may be electrically connected to the particular plurality of electrical pads 512*d* (FIG. 5B) of the first conductive layer 552, are configured such that portions of adhesive layer 557 (FIG. 5C; similar in layout to second adhesive layer 257 of FIG. 2D) positioned underneath and between the particular traces 556*a* are wider than each particular trace 556*a*, to thereby expose more evaporative surface area of the adhesive layer 557. Because adhesive layer 557 absorbs a non-trivial amount of liquid (mainly water) from the atmosphere (e.g., mainly before assembly of FPC into the HDD), the absorbed water lowers the FPC bubble temperature boundary by increasing the likelihood of vapor expansion and potential bubbling when heated. Thus, the narrower the traces 556*a* and the wider the exposed areas of the adhesive layer 557 positioned under and between the traces 556*a*, the more the absorbed water is enabled or encouraged to readily evaporate from the adhesive layer 557. Therefore, the less likely that bubbling will occur during soldering in the course of electrically interconnecting electrical pads 512*d* to corresponding electrical pads of a suspension tail 208*e* of suspension assembly 208 (FIG. 2A).

According to an embodiment, the width of each particular trace 556*a* is substantially consistent throughout the second conductive trace layer 556, based on and in view of the FPC manufacturing capabilities employed. For example, each trace 556*a* is formed as narrow as possible within the relevant design and manufacturing constraints. As with the embodiments of FIGS. 4A-4C, according to an embodiment the particular traces 556*a* of second conductive layer 556 are for signals to/from a corresponding fine actuator coupled with the suspension 208 (FIG. 2A). Because as discussed elsewhere herein, the positioning and physical dimensions of these fine actuator traces can be changed with little impact on their performance, as there is more design freedom allowed with these particular traces near the tip end.

Method of Manufacturing a Flexible Printed Circuit

Figure 6:
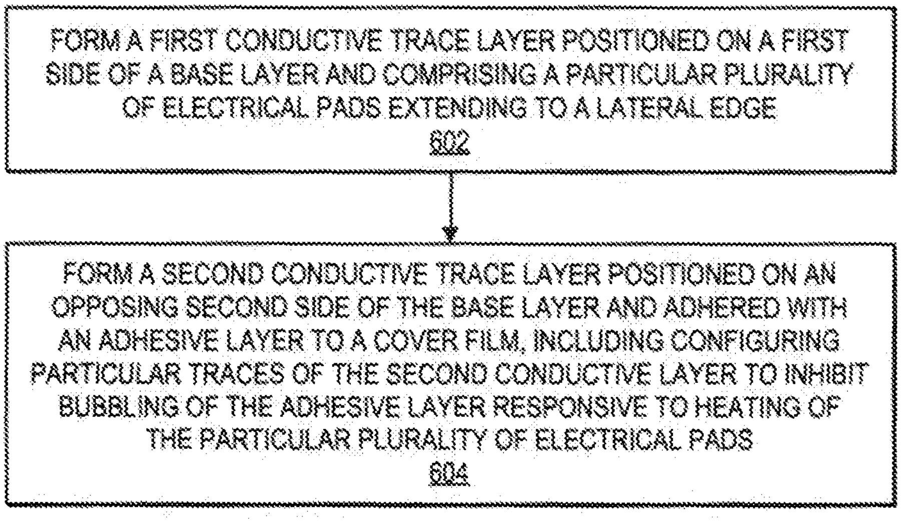
FIG. 6 is a flowchart illustrating a method of manufacturing a flexible printed circuit (FPC) laminate composition, according to an embodiment.

FIG. 6 is a flowchart illustrating a method of manufacturing a flexible printed circuit (FPC) laminate composition, according to an embodiment. For example, the method of FIG. 5 may be used to manufacture an FPC having a plurality of fingers extending from a root to a tip, such as FPC fingers 412*a* of an FPC 212 (FIGS. 2A-2D).

At block 602, form a first conductive trace layer positioned on a first side of a base layer and comprising a particular plurality of electrical pads extending to a lateral edge. For example, first conductive trace layer 452 (FIGS. 4A-4B), 552 (FIGS. 5A-5B) (see also first conductive layer 252 of FIG. 2D) is formed on a first side of a base layer (see, e.g., base film 254 of FIG. 2D) and comprises a plurality of electrical pads 412*d* (FIGS. 4A-4B), 512*d* (FIGS. 5A-5B) extending to a lateral edge of each FPC finger 412*a* (FIG. 4A), 512*a* (FIG. 5A).

At block 604, form a second conductive trace layer positioned on an opposing second side of the base layer and adhered with an adhesive layer to a cover film, including configuring particular traces of the second conductive trace layer to inhibit bubbling of the adhesive layer in response to heating of the particular plurality of electrical pads. For example and according to an embodiment, the second conductive trace layer 456 (FIGS. 4A, 4C; see also second conductive layer 256 of FIG. 2D) is formed on an opposing second side of the base layer 254 and adhered with an adhesive layer (see, e.g., second adhesive 257 of FIG. 2D) to a cover film (see, e.g., second cover film 258 of FIG. 2D), wherein particular traces of the second conductive trace layer 456 (e.g., those of first pattern 456*a* of FIG. 4C) are routed so as to substantially not be underneath the particular plurality of electrical pads 412*d* of the first conductive trace layer 452. Excessive heat transfer from the electrical pads 412*d* of the first conductive trace layer 452 to the second conductive trace layer 456 during soldering to a suspension assembly 208 (FIG. 2A), and consequent bubbling of FPC finger 412*a*, is thereby inhibited. For example and according to another embodiment, the second conductive trace layer 556 (FIGS. 5A, 5C; see also second conductive layer 256 of FIG. 2D) is formed on an opposing second side of the base layer 254 and adhered with an adhesive layer 557 (FIG. 5C; see also second adhesive 257 of FIG. 2D) to a cover film (see, e.g., second cover film 258 of FIG. 2D), wherein particular traces 556*a* of the second conductive trace layer 556 (e.g., those closest to the tip and/or corresponding to fine actuator signal traces) are formed and positioned such that portions of the adhesive layer 557 positioned generally underneath and between the particular traces 556*a* are wider than each particular trace 556*a*, to thereby expose more evaporative surface area of the adhesive layer 557. Excessive heat transfer from the electrical pads 512*d* of the first conductive trace layer 552 to the second conductive trace layer 556 during soldering to a suspension assembly 208 (FIG. 2A), and consequent bubbling of FPC finger 512*a*, is thereby inhibited.

Note here that the practical ordering of steps to manufacture an FPC may actually be such that block 604 is performed before block 602, as the FPC manufacturing process may lay up the laminate layers onto stiffener layer 260 in order from second cover film 258 through first cover film 250.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable", or "flexible printed circuit" (FPC)). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110*b* rides so that the slider 110*b* flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A hard disk drive flexible printed circuit (FPC) comprising:

a plurality of fingers extending from a root to a tip, each finger comprising:

a first conductive trace layer positioned on a first side of a base layer and comprising a particular plurality of electrical pads extending to a lateral edge, and a second conductive trace layer positioned on an opposing second side of the base layer and adhered with an adhesive layer to a cover film, wherein particular traces of the second conductive trace layer electrically connected to the particular plurality of electrical pads are routed so as to substantially not be underneath the particular plurality of electrical pads of the first conductive trace layer to inhibit heat transfer from the particular plurality of electrical pads to the second conductive trace layer.

2. The FPC of claim 1, wherein the particular plurality of electrical pads of the first conductive trace layer and the particular traces of the second conductive trace layer are positioned closest to the tip.

3. The FPC of claim 2, wherein an average lateral width of a first pattern of the particular traces of the second conductive trace layer, in an area of the particular plurality of electrical pads of the first conductive trace layer, is in a range of 45%-55% narrower than an average lateral width of a second pattern of the traces of the second conductive trace layer in a direction toward the root.

4. A hard disk drive comprising the FPC of claim 1.

5. A hard disk drive flexible printed circuit (FPC) comprising:

a plurality of fingers extending from a root to a tip, each finger comprising:

a first conductive trace layer positioned on a first side of a base layer and comprising a particular plurality of electrical pads extending to a lateral edge, and a second conductive trace layer positioned on an opposing second side of the base layer and adhered with an adhesive layer to a cover film, wherein particular traces of the second conductive trace layer electrically connected to the particular plurality of electrical pads are configured such that the adhesive layer between the particular traces is wider than each particular trace to expose evaporative surface area of the adhesive layer.

6. The FPC of claim 5, wherein a width of each particular trace is substantially consistent throughout the second conductive trace layer.

7. The FPC of claim 6, wherein the particular plurality of electrical pads of the first conductive trace layer and the particular traces of the second conductive trace layer are positioned closest to the tip.

8. A hard disk drive comprising the FPC of claim 5.

9. A method of manufacturing a flexible printed circuit (FPC) laminate composition having a plurality of fingers extending from a root to a tip, the method comprising:

forming a first conductive trace layer positioned on a first side of a base layer and comprising a particular plurality of electrical pads extending to a lateral edge; and forming a second conductive trace layer positioned on an opposing second side of the base layer and adhered with an adhesive layer to a cover film, including configuring particular traces of the second conductive trace layer electrically connected to the particular plurality of electrical pads to inhibit bubbling of the adhesive layer in response to heating of the particular plurality of electrical pads.

10. The method of claim 9, wherein configuring the particular traces of the second conductive trace layer includes routing the particular traces so as to substantially not be underneath the particular plurality of electrical pads of the first conductive trace layer, to inhibit heat transfer from the particular plurality of electrical pads to the second conductive trace layer.

11. The method of claim 10, wherein forming the first and second conductive trace layers includes forming the particular plurality of electrical pads and the particular traces of the second conductive trace layer closest to the tip.

12. The method of claim 10, wherein forming the second conductive trace layer includes forming a first pattern for the particular traces of the second conductive trace layer, in an area of the particular plurality of electrical pads of the first conductive trace layer, in a range of 45%-55% narrower than an average lateral width of a second pattern of for traces of the second conductive trace layer in a direction toward the root.

13. The method of claim 9, wherein configuring the particular traces of the second conductive trace layer includes forming the particular traces such that the adhesive layer between the particular traces is wider than each particular trace, to expose evaporative surface area of the adhesive layer.

14. The method of claim 13, wherein configuring the particular traces of the second conductive trace layer includes forming a width of each particular trace substantially consistent throughout the second conductive trace layer.

15. The method of claim 13, wherein forming the first and second conductive trace layers includes forming the particular plurality of electrical pads and the particular traces of the second conductive trace layer closest to the tip.

16. A hard disk drive (HDD) comprising:

a plurality of recording media rotatably mounted on a spindle;

a plurality of head sliders each housing a respective read-write transducer configured to read from and to write to at least one recording medium of the plurality of recording media;

means for moving the plurality of head sliders to access portions of the recording media; and a flexible printed circuit (FPC) configured to transmit electrical signals to and from the plurality of head sliders, the FPC comprising a plurality of fingers extending from a root to a tip, each finger comprising:

a first conductive trace layer positioned on a first side of a base layer and comprising a particular plurality of electrical pads extending to a lateral edge, and a second conductive trace layer positioned on an opposing second side of the base layer and adhered with an adhesive layer to a cover film, including means for inhibiting bubbling of the adhesive layer in response to heating of the particular plurality of electrical pads.

17. The HDD of claim 16, wherein the means for inhibiting includes particular traces of the second conductive trace layer electrically connected to the particular plurality of electrical pads positioned substantially not underneath the particular plurality of electrical pads of the first conductive trace layer to inhibit heat transfer from the particular plurality of electrical pads to the second conductive trace layer.

18. The HDD of claim 17, wherein an average lateral width of a first pattern of the traces of the second conductive trace layer, in an area of the particular plurality of electrical pads of the first conductive trace layer, is in a range of 45%-55% narrower than an average lateral width of a second pattern of the traces of the second conductive trace layer in a direction toward the root.

19. The HDD of claim 16, wherein the means for inhibiting includes particular traces of the second conductive trace layer electrically connected to the particular plurality of electrical pads formed such that the adhesive layer between the particular traces is wider than each particular trace to expose evaporative surface area of the adhesive layer.

20. The HDD of claim 19, wherein a width of each particular trace is substantially consistent throughout the second conductive trace layer.

* * * * *